United States Patent [19]
Banerjee et al.

[11] Patent Number: 4,837,746
[45] Date of Patent: Jun. 6, 1989

[54] METHOD AND APPARATUS FOR RESETTING A VIDEO SRAM

[75] Inventors: Pradip Banerjee, Sunnyvale; Paul D. Keswick, San Jose, both of Calif.

[73] Assignee: Advanced Micro Devices, Inc., Sunnyvale, Calif.

[21] Appl. No.: 805,158

[22] Filed: Dec. 4, 1985

[51] Int. Cl.$^4$ ..................... G11C 7/00; G11C 11/40
[52] U.S. Cl. .............................. 365/189.05; 365/222
[58] Field of Search .................. 365/222, 227, 189; 364/900

[56] References Cited
U.S. PATENT DOCUMENTS

| | | | |
|---|---|---|---|
| 4,586,166 | 4/1986 | Shah | 365/154 |
| 4,587,559 | 5/1986 | Longacre, Jr. et al. | 365/222 X |
| 4,608,666 | 8/1986 | Uchida | 365/189 X |

Primary Examiner—Stuart N. Hecker
Assistant Examiner—Alyssa H. Bowler
Attorney, Agent, or Firm—Fliesler, Dubb, Meyer & Lovejoy

[57] ABSTRACT

A method and apparatus for resetting a SRAM in a single DRAM-SRAM transfer cycle in a graphics system is described comprising a SRAM address decoder, a DRAM data input buffer, a reset data register and data lines. In operation, reset data is transferred into the DRAM data input buffer. Thereafter, the SRAM is isolated from the address decoder and the data lines and the reset data is transferred from the DRAM data input buffer into the reset data register. Then data is transferred in parallel between the DRAM and the SRAM. Upon completion of the transfer of data between the DRAM and the SRAM, the SRAM is recoupled to the data lines. After the SRAM is recoupled to the data lines, the reset data is transferred in parallel to the SRAM. Upon the transfer of the reset data to the SRAM, the system is returned to its pre-transfer cycle condition.

19 Claims, 3 Drawing Sheets

METHOD AND APPARATUS FOR RESETTING A VIDEO SRAM

BACKGROUND OF THE INVENTION

1. Field of the Invention

The present invention relates in general to graphics systems and in particular to a method and apparatus for resetting a video SRAM within a single DRAM-SRAM transfer cycle in a graphics system.

2. Description of Prior Art

A graphics system typically comprises a central processing unit (CPU), a memory and a video display (CRT).

In operation, data to be displayed on the CRT is transferred from the CPU to the memory and then onto the CRT. To maintain the display on the CRT, the data in the memory is repeatedly transferred to the CRT in what are called screen refresh cycles. New data or a change in the data to be displayed on the CRT is transferred to the memory in what are called update cycles. The refresh cycles always take priority over the update cycles.

In the initial development of graphics systems, the memory typically comprised a single dynamic random access memory (DRAM) which was used both for refreshing the screen and for receiving video updates. However, because of the priority given to the refresh function, the update of the DRAM was constrained to those periods of time when the CRT was in a blanking cycle, i.e. returning to its initial state after scanning a line or returning to its initial state at the end of a frame scan. As a result, the updating of the DRAM was typically limited to a period of approximately 13% of the DRAM operating time.

To isolate the refresh and updating functions of the then current video graphics systems and to thereby increase the time available for updating the DRAM and for freeing the DRAM for use in other data processing operations, an improvement in video graphic systems was made comprising the use of a static random access memory (SRAM) in combination with a DRAM. In the improved system there was provided a CPU, a DRAM input register, a DRAM, a DRAM output register, data transfer gates, an SRAM and an SRAM output register.

In operation, video data for updating the DRAM is transferred from the CPU to the DRAM input register and then to the DRAM. From the DRAM, the data may be transferred to the DRAM output register and back to the CPU for further processing or, via the transfer gates, in parallel to the SRAM. From the SRAM the data is transferred to the SRAM output register for use in refreshing the CRT.

In practice, the data for updating the DRAM is serially transferred from the CPU to the DRAM. For a DRAM comprising 256 rows, a complete data transfer requires 256 DRAM cycles. The data transfer from the DRAM to the SRAM being in parallel requires 1 DRAM cycle, for a total of 257 DRAM cycles.

An example of the above-described improved DRAM-SRAM graphics system is disclosed in U.S. patent application Ser. No. 564,969, filed Dec. 23, 1983, entitled Improved Semiconductor Device for Serial Scan Applications and assigned to the assignee of the present application.

In still another improvement in video graphics systems, an SRAM input register is provided for use between an external source of video data and an SRAM.

In operation, video data from the external source is transferred from the source to the SRAM input register. From the SRAM input register, the data is transferred serially into the SRAM. For an SRAM comprising 256 column cells, the serial transfer requires 256 SRAM cycles.

Data transfers using SRAM cycles are typically faster than data transfers using DRAM cycles. For example, in a typical serial SRAM data transfer, the data transfer is 4 times faster than a typical serial DRAM data transfer. Accordingly, a 256 step serial SRAM data transfer requires only 64 DRAM cycle times.

Another advantage of the latter system is that the provision of a separate SRAM input register coupled to an external source permits data transfers to the SRAM without going through the DRAM.

While providing a reduction in the time it takes for storing data in an SRAM from an external source, the above-described improvements in video graphic systems do not provide a method or an apparatus for resetting an SRAM and/or a DRAM in less than 25% of the time it takes to ordinarily load a DRAM in a conventional manner.

SUMMARY OF THE INVENTION

In view of the foregoing, objects of the present invention are a method and an apparatus for loading or resetting an SRAM within a single DRAM-SRAM transfer cycle.

In accordance with the above objects, there is provided in a video graphics system comprising a DRAM and an SRAM such as is disclosed in the aforementioned U.S. patent application Ser. No. 564,969, a plurality of circuits for generating reset control signals, an SRAM WRITE CONTROL CLOCK generator, a reset register, a multiplexer and pass gate control circuits for controlling data transfers to and from the SRAM.

Among the reset control signal generating circuits there is provided a plurality of circuits which are responsive to existing control signals for generating a plurality of control signals for controlling the SRAM WRITE CONTROL CLOCK generator, the reset register, the multiplexer and the pass gates used for controlling data transfers to and from the SRAM during an SRAM reset operation.

In the reset register there is provided a plurality of stages for temporarily storing data bits which define one of a plurality of video graphic backgrounds. For example, with 4 bits the SRAM can be set or reset to 16 different backgrounds.

In the multiplexer there is provided at least two inputs for selectively transferring data to the SRAM from a conventional SRAM input register or the SRAM RESET register.

In the pass gate control circuits there is provided a plurality of gates for selectively coupling and decoupling the SRAM to and from a conventional address decoder and latch circuit, to and from a DRAM and to and from conventional data lines.

In operation, the only time the DRAM and SRAM and associated control signals are not used for transferring data via their respective input and output registers is during a data transfer between the DRAM and the SRAM, i.e. from the DRAM to the SRAM or from the SRAM to the DRAM. Taking advantage of this fact, the method and apparatus of the present invention resets the SRAM during a conventional DRAM-to-SRAM transfer cycle. Of course, in an alternative embodiment of the present invention, the SRAM-to-DRAM transfer cycle could also be used by means of a suitable choice of control signals.

When a user wishes to reset the SRAM, i.e. provide a particular background on the screen of the CRT, e.g. white, black, red, blue, etc., the user transfers data bits defining the desired background to the DRAM input data buffer. This occurs at the beginning of a conventional DRAM-to-SRAM transfer cycle. After the desired reset bits are stored in the DRAM input data buffer, the user initiates the reset cycle by changing the state of at least one control signal, e.g. the static output enable/reset ($\overline{SG/R}$) control signal, from its normal low condition during a normal DRAM-to-SRAM transfer cycle to a high condition.

The combination of the setting of the $\overline{SG/R}$ control signal to an abnormal high condition and other conventional DRAM-to-SRAM transfer control signals are then used to cause the RESET control signal generating circuits to generate a sequence of RESET control signals. As the RESET control signals are generated, they operate to cause, in sequence, the decoupling of the SRAM from the SRAM decoder and latch circuit and from the SRAM data lines, the transferring of the reset data from the DRAM input buffer to the RESET REGISTER, the transferring of data from the DRAM to the SRAM, the recoupling of the SRAM to the SRAM data lines, the transferring of the reset data from the RESET REGISTER to the SRAM via the SRAM data lines and, thereafter, returning the system to its pre-reset condition, all with a normal DRAM-to-SRAM transfer cycle.

The method and apparatus of the present invention provides several advantages. One of the advantages is that an SRAM can now be reset 64 times faster than heretofore possible.

Another advantage is that once the SRAM is reset using the method and apparatus of the present invention, existing conventional parallel transfer gates may be used for resetting the DRAM coupled thereto during conventional SRAM-to-DRAM transfer cycles.

BRIEF DESCRIPTION OF THE DRAWING

The above and other objects, features and advantages of the present invention will become apparent from the following detailed description of the accompanying drawing in which.

DETAILED DESCRIPTION OF THE DRAWING

Figure 1:
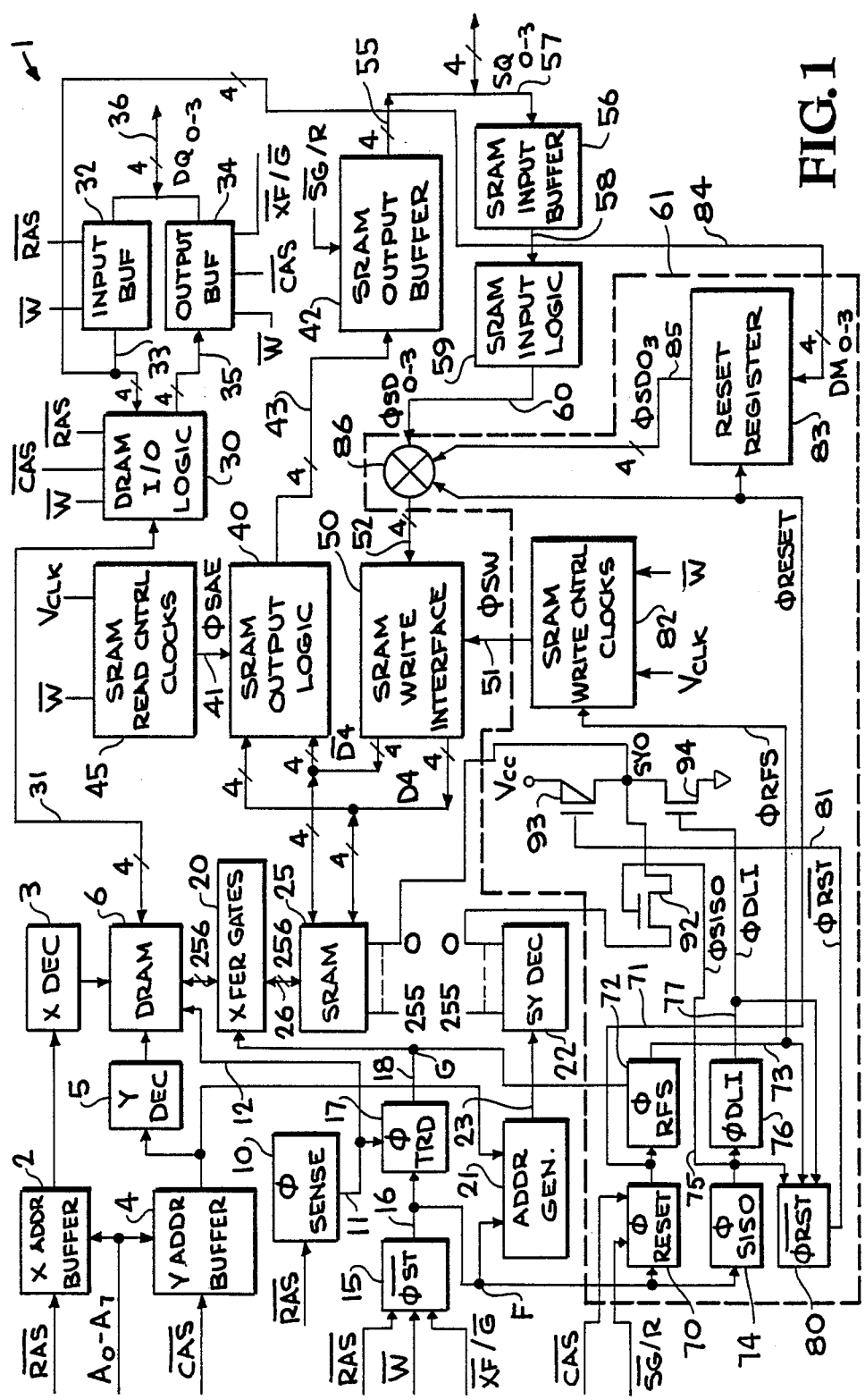
FIG. 1 is a block diagram of a graphics system incorporating the present invention.

Referring to FIG. 1, there is provided in accordance with the present invention a graphics system designated generally as 1. In the system 1 there is provided an X address buffer 2. In the X address buffer 2 there is provided a first input for receiving a row address strobe control signal ($\overline{RAS}$), a second input for receiving an address (A0–A7) and an output coupled to an X decoder 3.

Below the buffer 2 there is provided a Y address buffer 4. In the Y address buffer 4 there is provided a first input for receiving the address A0–A7 and a second input for receiving a column address strobe control signal ($\overline{CAS}$) and an output coupled to a Y decoder 5. The X decoder 3 is coupled to the word lines of a dynamic random access memory (DRAM) 6. The Y decoder 5 is coupled to the bit lines of the DRAM 6. As will be further described below, while only one DRAM is shown, in a preferred embodiment of the system 1, four DRAM's are provided.

Below the Y address buffer 4 there is provided a $\phi$SENSE circuit 10. In the $\phi$SENSE circuit 10 there is provided an input for receiving the control signal $\overline{RAS}$ and an output for providing a control signal $\phi$SENSE on an output line 11. The control signal $\phi$SENSE is provided to the DRAM 6 on a line 12 for enabling the DRAM sense amplifiers in a conventional manner.

Below the $\phi$SENSE circuit 10 there is provided a $\phi\overline{ST}$ circuit 15. The $\phi\overline{ST}$ circuit is provided with a first input for receiving the control signal $\overline{RAS}$, a second input for receiving a write enable signal ($\overline{W}$) and a third input for receiving a transfer/output enable for DRAM control signal ($\overline{XF/G}$) and an output for providing a control signal $\phi\overline{ST}$ on an output line 16.

Coupled to the output lines 11 and 16 there is provided a $\phi$TRD circuit 17. The circuit 17 is provided for providing in response to the control signals $\phi$SENSE and $\phi\overline{ST}$, a control signal $\phi$TRD on an output line 18. Coupled to the output line 18 there is provided a transfer gate circuit designated generally as 20. As will be described further below, the transfer gate circuit 20 in the embodiment described herein comprises 256 transfer pass gates for each of the DRAM's in the system 1.

Below the $\phi$TRD circuit 17 and coupled to the output line 16 of the $\phi\overline{ST}$ and the output of the Y address buffer 4, there is provided an address generator 21. In the address generator 21 there is provided an output for providing addresses to an SRAM decoder 22 on an address bus 23.

Above the decoder 22 there is provided a static random access memory (SRAM) 25. The SRAM 25 is coupled to a plurality of data lines DL and $\overline{DL}$ and to the transfer gates 20 by a plurality of bit lines 26.

While only one SRAM is shown, in a preferred embodiment of the present invention there is provided a separate SRAM for each DRAM. The data lines DL and $\overline{DL}$ are shown as comprising 4 pairs of data lines to show that the SRAM 25 actually comprises 4 SRAM's, one coupled to each pair of data lines DL and $\overline{DL}$ in a conventional manner.

The DRAM 6 is coupled to a DRAM input/output logic circuit 30 by means of a data bus 31. As in the case of the data lines DL and $\overline{DL}$, the bus 31 is shown as comprising 4 pairs of data lines to show that the DRAM 6 actually comprises 4 DRAM's, one coupled to each pair of data lines in a conventional manner.

In the circuit 30 there is provided a first input for receiving the control signal $\overline{W}$, a second input for receiving the control signal $\overline{CAS}$ and a third input for receiving the control signal $\overline{RAS}$. The circuit 30 is also coupled to a DRAM data input buffer 32 by means of a data bus 33 and a data output buffer 34 by means of a data bus 35.

In the input buffer 32 there is provided a first input for receiving the control signal $\overline{W}$ and a second input for receiving the control signal $\overline{RAS}$.

In the data output buffer 34 there is provided a first input for receiving the control signal $\overline{W}$, a second input for receiving the control signal $\overline{CAS}$, and a third input for receiving the control SIGNAL $\overline{XF}/\overline{G}$. The input buffer 32 and the output buffer 34 are also coupled to a data input/output bus 36 for transferring 4 bits of data $DQ_{0-3}$ to and from the DRAM 6.

The data lines DL and $\overline{DL}$ are coupled to an SRAM output logic circuit 40. In the logic circuit 40 there is provided an input for receiving a control signal $\phi SAE$ on a control signal line 41 and an output for providing data to an SRAM output buffer 42 on a data bus 43.

Located above the SRAM output logic circuit 40 there is provided an SRAM read control clock circuit 45. In the circuit 45 there is provided a first input for receiving the control signal $\overline{W}$, a second input for receiving system clock pulses $V_{CLK}$ and an output coupled to the control line 41 for providing thereon the control signal $\phi SAE$.

Also coupled to the data lines DL and $\overline{DL}$ there is provided an SRAM write interface circuit 50. In the write interface circuit 50 there is provided an input for receiving a control signal $\phi SW$ on a control signal line 51 and a plurality of inputs coupled to a data input bus 52.

In the SRAM output buffer 42 there is provided an input for receiving a static output enable/reset control signal ($\overline{SG}/R$) and an output coupled to an output data bus 55.

Below the SRAM output buffer 42 in FIG. 1 there is provided an SRAM input buffer 56. In the SRAM input buffer 56 there is provided an input coupled to a data input bus 57 and an output coupled to an output data bus 58. The data bus 58 is in turn coupled to an input of an SRAM input logic circuit 59. In the logic circuit 59 there is also provided an output coupled to a data bus 60.

In the lower portion of FIG. 1, there is shown a number of circuits enclosed within a broken line designated generally as 61. The circuits enclosed within the broken line 61 are used for resetting the SRAM 25 during a single DRAM-SRAM transfer cycle, as will be further described below.

Below the address generator 21 there is provided a $\phi RESET$ circuit 70. In the $\phi RESET$ circuit 70 there is provided a first input coupled to the control signal line 16 for receiving the control signal $\phi \overline{ST}$, a second input for receiving the control signal $\overline{SG}/R$, a third input for receiving the control signal $\overline{CAS}$ and an output for providing a control signal $\phi RESET$ on a control signal line 71.

Coupled to the control signal line 71 and the output line 18 from the $\phi TRD$ circuit 17, there is provided a $\phi RFS$ circuit 72. In the $\phi RFS$ circuit 72 there is provided an output for providing a control signal $\phi RFS$ on a control signal line 73.

Below the $\phi RESET$ circuit 70 there is provided a $\phi SISO$ circuit 74. In the $\phi SISO$ circuit 74 there is provided an input coupled to the control signal line 16 from the $\phi \overline{ST}$ circuit 15 and an output for providing a control signal $\phi SISO$ on a control signal line 75.

Coupled to the control signal line 75 there is provided an input of a $\phi DLI$ circuit 76. In the $\phi DLI$ circuit 76 there is also provided an output for providing a control signal $\phi DLI$ on a control signal line 77.

Below the $\phi SISO$ circuit 74 there is provided a $\phi \overline{RST}$ circuit 80. In the $\phi \overline{RST}$ 80 there is provided a first input coupled to the control signal line 75, a second input coupled to the control signal line 73 and a third input coupled to the control signal line 77 for receiving the control signals $\phi SISO$, $\phi RFS$, and $\phi DLI$, respectively, and an output for providing a control signal $\phi \overline{RST}$ on a control signal line 81.

Below the SRAM write interface circuit 50 there is provided an SRAM write control clock circuit 82. In the circuit 82 there is provided a first input coupled to the control signal line 73 for receiving the control signal $\phi RFS$, a second input for receiving the control signal $\overline{W}$, a third input for receiving the system clock pulses $V_{CLK}$ and an output coupled to the output signal line 51 for providing the control signal $\phi SW$ to the SRAM write interface circuit 50.

To the right of the clock circuit 82 there is provided a reset register 83. In the reset register 83 there is provided an input for receiving 4 bits of reset data $DM_{0-3}$ from the DRAM data input buffer 32 on a data bus 84, an input coupled to the control signal line 71 for receiving the control signal $\phi RESET$ and an output for providing 4 bits of reset data $\phi SD_{0-3}$ on a data bus 85.

Coupled to the reset register 83 by means of the data bus 85 there is provided a multiplexer 86. In the multiplexer 86 there is provided one input coupled to the data bus 60, a second input coupled to the data bus 85, a third input coupled to the control signal line 71 for receiving the control signal $\phi RESET$ and an output for providing data from the reset register 83 or the SRAM input logic circuit 59 on the data bus 52.

Figure 2:
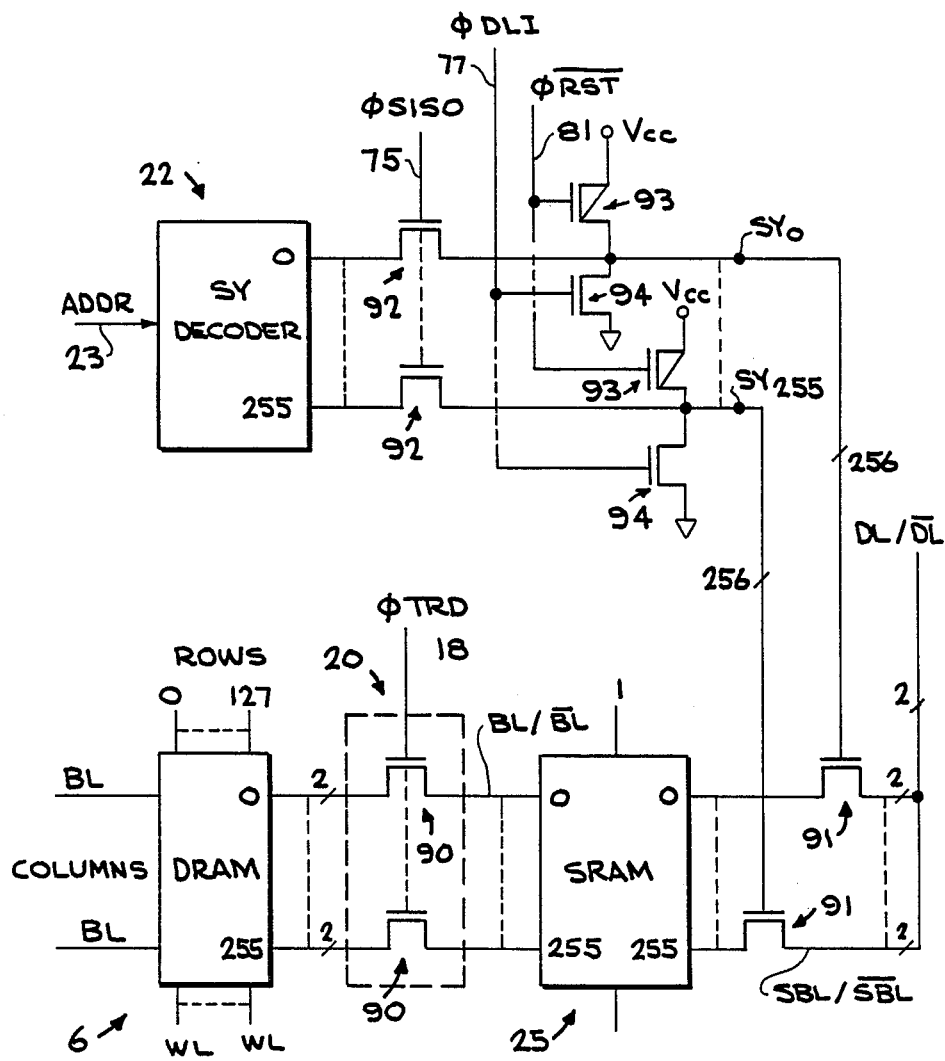
FIG. 2 is a more detailed block diagram of a DRAM-SRAM and decoder circuit according to the present invention.

Referring to FIG. 2, the DRAM 6, SRAM 25, the decoder circuit 22 and the associated gating circuits will now be described in more detail. However, it should be kept in mind that in a preferred embodiment of the present invention, 4 sets of such circuits will be provided, with one such set of circuits coupled to each pair of data lines DL and $\overline{DL}$.

In the DRAM 6 there is provided 256 pairs of bit lines designated 0–255 and 128 word lines designated 0–127. Each pair of the bit lines in the DRAM 6 is coupled to a pair of transfer pass gates 90, only one of which is shown for each bit line pair. The control electrodes of all of the transfer gates 90 are coupled in parallel to the control signal line 18 for receiving the control signal $\phi TRD$.

In the SRAM 25 there is provided 256 pairs of bit lines designated 0–255 and one word line designated 1. Each of the pairs of bit lines in the SRAM 25 is coupled to a corresponding pair of the pass gates 90 and to the data lines DL and $\overline{DL}$ by a pair of pass gates 91, only one of which is shown.

In the decoder 22 there is provided 256 outputs designated 0–255. Each of the outputs of the decoder is coupled to a corresponding one of the control electrodes of the pass gates 91 through a pass gate 92. The control electrodes of all of the pass gates 92 are coupled in parallel to the control signal line 75 for receiving the control signal $\phi SISO$.

Coupled to a node SY between the control electrode of each of the pass gates 91 and the pass gates 92, there is provided a complementary gating circuit comprising a pair of complementary gates 93 and 94. The control electrodes of all of the gates 93 are coupled in parallel to the control signal line 81 for receiving the control signal $\phi \overline{RST}$. The control electrodes of all of the gates 94 are coupled in parallel to the control signal line 77 for receiving the control signal φDLI.

The simultaneous resetting of all of the SRAM cells to the same state in each of the 4 SRAM arrays in system 1 is provided preferably during an otherwise conventional DRAM-to-SRAM data transfer cycle by using and re-interpreting control signals used for the DRAM-to-SRAM transfer cycle.

As will be described in detail below, during a DRAM-to-SRAM transfer cycle, the state of the SRAM output buffer control signal $\overline{SG}/R$ is used to determine whether or not the SRAM is to be reset. If $\overline{SG}/R$ is high when $\overline{CAS}$ goes low, the SRAM is reset to a background state, otherwise it is not. The background state for each of the 4 SRAM arrays is defined by one of the four bits of reset data $DQ_{0-3}$ which are latched into the DRAM input buffer at the start of the DRAM-to-SRAM transfer cycle.

Figure 3:
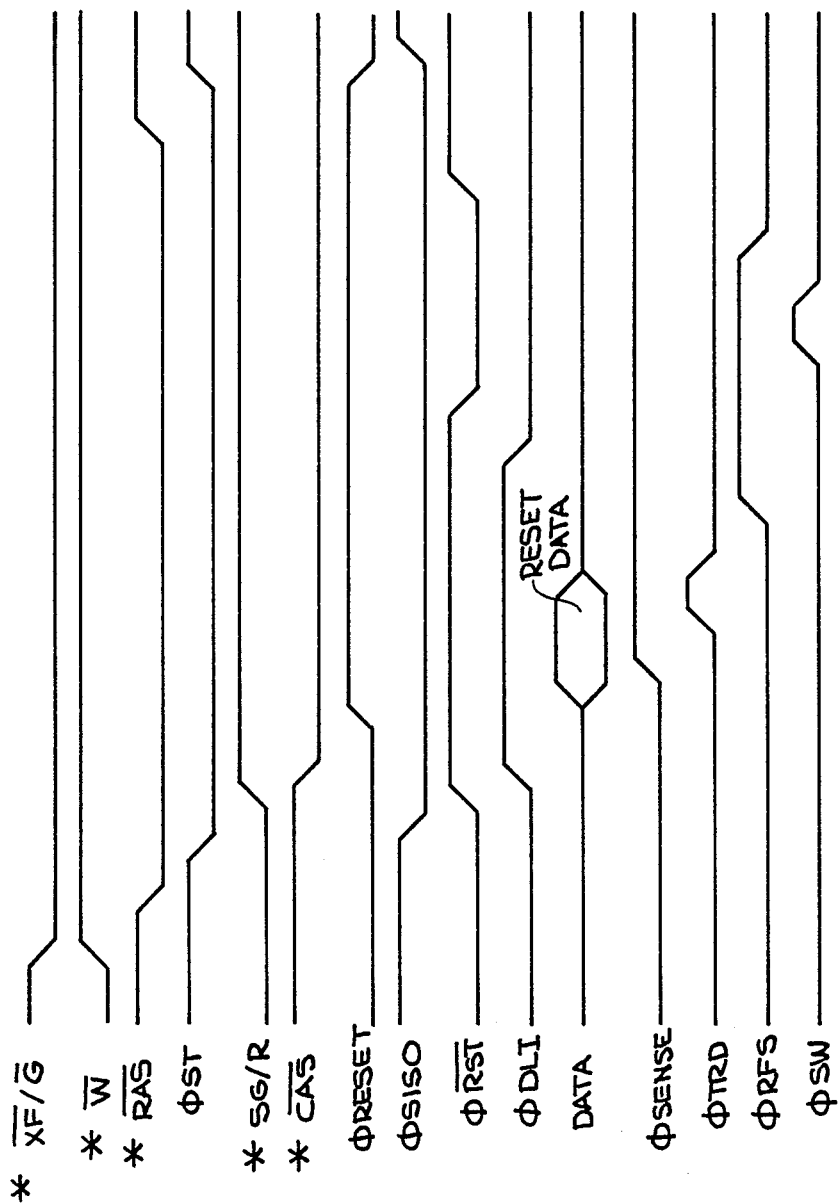
FIG. 3 is a diagram of control signals generated according to the present invention.

Referring to FIG. 3, in operation, when a user wants to reset the SRAM, i.e. provide a background on the video display, the user drives $\overline{XF}/G$ low and $\overline{W}$ high. Thereafter, the user drives $\overline{RAS}$ low. When $\overline{RAS}$ is driven low:

1. Reset data $DQ_{0-3}$ on the bus 36 is latched into the DRAM input buffer 32, and
2. $\overline{\phi ST}$ is driven low defining the start of a DRAM-to-SRAM transfer cycle.

A predetermined time after $\overline{RAS}$ is driven low, φSENSE is driven high in a conventional manner for enabling the DRAM sense amplifiers for a DRAM-to-SRAM data transfer.

Meanwhile, when $\overline{\phi ST}$ goes low and before φSENSE is driven high:

1. φSISO is driven low disabling the gates 92 and isolating the SRAM 25 from the SRAM decoder circuit 22;
2. $\overline{\phi RST}$ is driven high; and
3. A short time later, φDLI is driven high, disabling the pass gates 91 and isolating the SRAM from the data lines DL and $\overline{DL}$.

After the SRAM is isolated from the SRAM decoder 22 and the data lines DL and $\overline{DL}$ the user drives $\overline{SG}/R$ high and $\overline{CAS}$ low, driving φRESET high.

Driving φRESET high latches the RESET data $DM_{0-3}$ from the DRAM input buffer 32 into the RESET register 83 and switches the multiplexer 86 to couple the bus 85 and the bus 52.

After the φRESET is driven high, φSENSE goes high, enabling the DRAM sense amplifiers and generating the pulse φTRD which enables the pass gates 90 between the DRAM 6 and the SRAM 25 to effect a transfer of data from the DRAM to the SRAM.

On the trailing edge of the pulse φTRD, φTRD and φRESET combine to drive φRFS high. Driving φRFS high starts a self-timed SRAM RESET function.

When φRFS goes high:

1. φDLI is driven low;
2. a short time later, $\overline{\phi RST}$ is driven low driving all of the nodes $SY_{0-255}$ high, coupling all SRAM cells in parallel to the SRAM data lines DL and $\overline{DL}$; and
3. the pulse φSW is generated transferring the RESET data $\phi SD_{0-3}$ from the RESET register 83 through the SRAM write interface circuit 50 to the SRAM data lines DL and $\overline{DL}$ and thereby in parallel, into all of the SRAM cells.

After the pulse φSW goes low, φRFS is driven low ending the resetting of the SRAM 25.

φRFS going low drives $\overline{\phi RST}$ high.

After $\overline{\phi RST}$ is driven high, the user terminates the DRAM-to-SRAM transfer cycle by driving $\overline{RAS}$ high.

$\overline{RAS}$ going high drives φRESET low and $\overline{\phi ST}$ high.

$\overline{\phi ST}$ going high drives φSISO high, thereby recoupling the SRAM to the decoder circuit 22.

At the end of the DRAM-to-SRAM transfer cycle in which the SRAM is reset, the SRAM is used for refreshing the screen with the reset data, i.e. a uniform background, and/or to reset the DRAM by means of SRAM-to-DRAM transfer cycles in a conventional manner.

While a preferred embodiment of the present invention is described above, it is contemplated that various changes may be made thereto without departing from the spirit and scope of the present invention. For example, while the invention is described with reference to the use of an SRAM and a DRAM in a graphics system, it is to be understood that other types of memories may be used. Accordingly, the above description should be considered only as illustrative of the present invention and its scope should be determined by the claims hereinafter provided.

What is claimed is:

1. A method of resetting a first memory during a data transfer cycle between a second memory and said first memory in a graphics system having a second memory with a plurality of bit lines, a first memory with a plurality of bit lines, a first memory address decoder, a RESET data register and data lines, comprising in sequence the steps of:

isolating said first memory bit lines from said data lines;
   isolating said first memory from said decoder;
   transferring RESET data into said RESET data register;
   transferring data in parallel between said second memory bit lines and said first memory bit lines;
   isolating said first memory bit lines from said second memory bit lines upon the completion of said data transfer between said second memory and said first memory;
   coupling said first memory bit lines in parallel to said data lines; and
   transferring said RESET data from said RESET data register to said first memory bit lines via said data lines.

2. A method according to claim 1 wherein said isolating step comprises the step of disabling pass gates coupling said first memory bit lines to said first memory decoder and said data lines, said step of transferring data between said second memory bit lines and said first memory bit lines comprises the step of enabling pass gates coupling said second memory bit lines and said first memory bit lines, and said coupling step comprises the step of enabling said pass gates coupling said first memory bit lines and said data lines.

3. A method according to claim 2 wherein said step of enabling pass gates coupling said second memory bit lines and said first memory bit lines comprises the step of enabling said pass gates during a data transfer from said second memory bit lines to said first memory bit lines.

4. A method according to claim 3 wherein said first memory comprises an SRAM and said second memory comprises a DRAM.

5. A method of resetting a first memory during a data transfer cycle between a second memory and said first memory in a graphics system having said first memory, said second memory, a means for addressing said first memory, means for transferring data between said first and said second memories, data lines, and means for transferring data between said first memory and said data lines, comprising the steps of:

isolating said first memory from said addressing means and said data lines;

transferring data between said second memory and said first memory;

isolating said first memory bit lines from said second memory bit lines; and transferring reset data from said data lines to said first memory in response to a signal indicating the completion of said data transfer between said second memory and said first memory.

6. A method according to claim 5 wherein each of said memories comprise a plurality of memory cells and said steps of transferring data between said second memory and said first memory and between said data lines and said first memory comprise the steps of:

transferring said data in parallel from said memory cells in said second memory to said memory cells in said first memory; and transferring said data in parallel from said data lines to all of said memory cells in said first memory.

7. A method according to claim 6 wherein said first memory comprises an SRAM and said second memory comprises a DRAM.

8. An apparatus for resetting a first memory having a plurality of bit lines during a data transfer cycle between a second memory having a plurality of bit lines and said first memory in a graphics system also having a first memory address decoder, a second memory data input buffer, a RESET data register and data lines comprising:

means for transferring RESET data into said second memory data input buffer;

means for isolating said first memory bit lines from said decoder and said data lines;

means for transferring said RESET data from said second memory data input buffer into said RESET data register;

means for transferring data in parallel between said second memory bit lines and said first memory bit lines while said first memory bit lines are isolated from said decoder and said data lines;

means for coupling said first memory bit lines in parallel to said data lines upon the completion of said data transfer between said second memory and said first memory after isolating said first memory bit lines from said second memory bit lines; and means for transferring said RESET data from said RESET data register to said first memory bit lines via said data lines.

9. An apparatus according to claim 8 wherein said isolating means comprises means for disabling pass gates coupling said first memory bit lines to said first memory decoder and said data lines, said means for transferring data between said second memory bit lines and said first memory bit lines comprises means for enabling pass gates coupling said second memory bit lines and said first memory bit lines, and said coupling means comprises means for enabling said pass gates coupling said first memory bit lines and said data lines.

10. An apparatus according to claim 9 wherein said means for enabling pass gates coupling said second memory bit lines and said first memory bit lines comprises means for enabling said pass gates during a data transfer from said second memory bit lines to said first memory bit lines.

11. An apparatus according to claim 10 wherein said first memory comprises an SRAM and said second memory comprises a DRAM.

12. In a graphics system having a second memory, a first memory, and data lines coupled to said first memory, an apparatus for resetting said first memory comprising:

first data transferring means for transferring data in parallel between said second memory and said first memory within a data transfer cycle;

means for storing reset data; and second data transferring means for transferring said reset data in parallel from said reset data storing means to said first memory via said data lines upon the completion of a data transfer between said second memory and said first memory within said data transfer cycle.

13. An apparatus according to claim 12 wherein said first data transferring means comprises means for transferring data from said second memory to said first memory and said second data transferring means comprises means responsive to said first data transferring means for transferring said reset data from said reset data storing means to said first memory via said data lines upon the completion of a data transfer from said second memory to said first memory.

14. An apparatus according to claim 13 wherein said first memory comprises an SRAM and said second memory comprises a DRAM.

15. An apparatus for resetting a first memory during a transfer cycle between said first memory and a second memory comprising:

a second memory having a plurality of bit lines;

a first memory having a plurality of bit lines;

first pass gate means for transferring data between each of said second memory bit lines and a corresponding one of said first memory bit lines;

a plurality of data lines;

second pass gate means for transferring data between each of said first memory bit lines and said data lines, said second pass gate means having control electrode means;

first memory address decoder means having a plurality of outputs;

third pass gate means for transferring control signals from each of said first memory decoder outputs to a corresponding one of said control electrode means of said second pass gate means;

fourth gate means coupled to said control electrode means of said second pass gate means between said second and said third pass gate means;

second memory data input buffer means;

RESET register means coupled to said second memory data input buffer means;

first memory write interface circuit means coupled to said data lines;

multiplexer means coupled between said RESET register means and said first memory write interface circuit means;

means for generating and $\overline{RAS}$ and $\overline{W}$ control signals coupled to said second memory data input buffer means for transferring RESET data into said buffer means;

means for generating a $\phi$SISO control signal coupled to said third pass gate means for disabling said third pass gate means;

means for generating φDLI and φRST control signals coupled to said fourth gate means for disabling said second pass gate means;

means for generating a φRESET control signal coupled to said RESET register and said multiplexer for transferring said RESET data from said second memory data input buffer to said first memory write interface circuit;

means for generating a pulse φTRD coupled to said first pass gate means for enabling said first pass gate means after said second and said third pass gate means are disabled;

means for changing the state of said φDLI and φRST control signals coupled to said fourth gate means for enabling said second gate means after the termination of said pulse φTRD; and means for generating a pulse φSW coupled to said first memory write interface circuit for clocking said RESET data from said multiplexer, through said first memory write interface circuit to all of said first memory bit lines in parallel via said data lines after said second gate means are enabled.

16. An apparatus according to claim 15 wherein said first memory comprises an SRAM and said second memory comprises a DRAM.

17. An apparatus for resetting a first memory during a data transfer cycle between a second memory and said first memory in a graphics system having said first memory, said second memory, a means for addressing said first memory and data lines, comprising:

means for isolating said first memory from said addressing means;

means for transferring data between said second memory and said first memory; and means for transferring reset data from said data lines to said first memory in response to a signal indicating the completion of said data transfer between said second memory and said first memory.

18. An apparatus according to claim 17 wherein each of said memories comprise a plurality of memory cells and said steps of transferring data between said second memory and said first memory and between said data lines and said first memory comprise:

means for transferring said data in parallel from said memory cells in said second memory to said memory cells in said first memory; and means for transferring said data in parallel from said data lines to all of said memory cells in said first memory.

19. An apparatus according to claim 18 wherein said first memory comprises an SRAM and said second memory comprises a DRAM.

* * * * *